US006736901B2

United States Patent
Nishibayashi

(10) Patent No.: US 6,736,901 B2
(45) Date of Patent: May 18, 2004

(54) VERTICAL CHEMICAL VAPOR DEPOSITION SYSTEM

(75) Inventor: Michio Nishibayashi, Numazu (JP)

(73) Assignee: Toshiba Machine Co., Ltd., Tokyo (JP)

( * ) Notice: Subject to any disclaimer, the term of this patent is extended or adjusted under 35 U.S.C. 154(b) by 94 days.

(21) Appl. No.: 10/206,973

(22) Filed: Jul. 30, 2002

(65) Prior Publication Data

US 2003/0029381 A1 Feb. 13, 2003

(30) Foreign Application Priority Data

Aug. 10, 2001 (JP) ........................................ 2001-244603

(51) Int. Cl.[7] .............................................. C23C 16/00
(52) U.S. Cl. ...................... 118/666; 118/712; 118/713; 118/724; 118/725; 118/728
(58) Field of Search .................................. 118/663, 666, 118/695, 696, 707, 712, 713, 715, 724, 725, 728–730

(56) References Cited

U.S. PATENT DOCUMENTS

| | | | | |
|---|---|---|---|---|
| 4,770,121 A | * | 9/1988 | Ebata et al. ................. 118/686 |
| 4,982,693 A | * | 1/1991 | Ebata ........................... 118/666 |
| 5,062,386 A | * | 11/1991 | Christensen ................. 118/725 |
| 5,063,031 A | * | 11/1991 | Sato ............................. 29/25.01 |
| 5,444,217 A | * | 8/1995 | Moore et al. ................ 219/405 |
| 5,710,407 A | * | 1/1998 | Moore et al. ................ 219/405 |
| 6,093,244 A | * | 7/2000 | Easoz et al. ................... 117/15 |
| 6,153,012 A | * | 11/2000 | Rupp et al. .................. 118/715 |
| 6,436,796 B1 | * | 8/2002 | Mailho et al. .............. 438/478 |
| 2003/0029381 A1 | * | 2/2003 | Nishibayashi ............... 118/712 |

FOREIGN PATENT DOCUMENTS

| JP | 2-5518 | * | 1/1990 |
| JP | 2-52432 | | 4/1990 |
| JP | 2001-13014 | * | 1/2001 |

* cited by examiner

Primary Examiner—Jeffrie R. Lund
(74) Attorney, Agent, or Firm—Pillsbury Winthrop LLP

(57) ABSTRACT

A susceptor is arranged in a reaction chamber, and an induction heating coil is arranged at a lower side of the susceptor. A ceiling of a bell jar is provided with an observation port, and an infrared radiation thermometer is arranged outside the observation port. A control unit controls the turning angle of the infrared radiation thermometer with a stepping motor, and detects the temperature of the susceptor at predetermined positions in radial direction. The control unit adjusts the heights of the induction heating coil at support positions, and uniforms the temperature distribution within the surface of the susceptor.

7 Claims, 4 Drawing Sheets

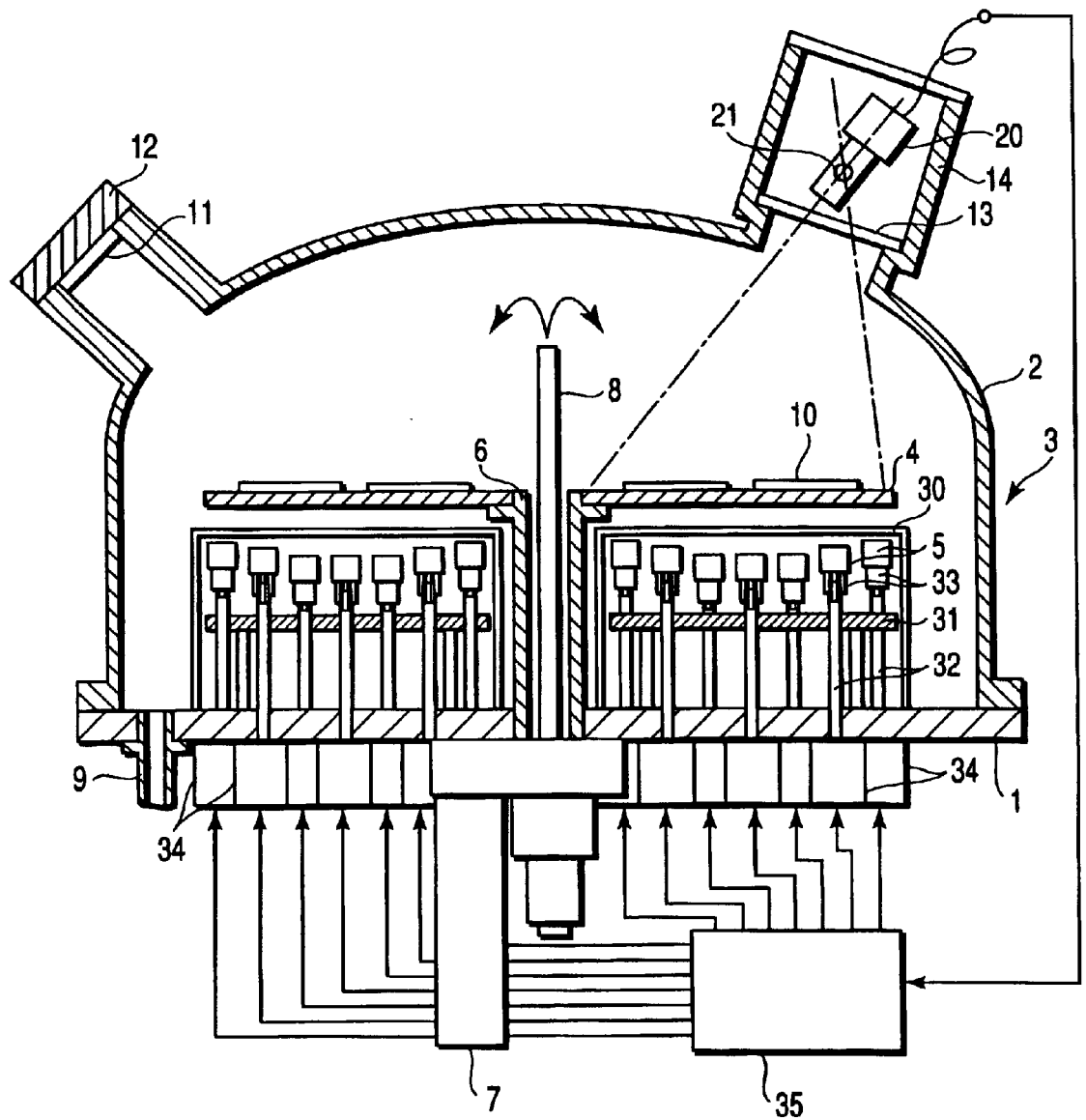
F I G. 1

VERTICAL CHEMICAL VAPOR DEPOSITION SYSTEM

CROSS-REFERENCE TO RELATED APPLICATIONS

This application is based upon and claims the benefit of priority from the prior Japanese Patent Application No. 2001-244603, filed Aug. 10, 2001, the entire contents of which are incorporated herein by reference.

BACKGROUND OF THE INVENTION

1. Field of the Invention

The present invention relates to a vertical chemical vapor deposition system. In particular, the present invention relates to a device for improving the temperature distribution within a susceptor in a vertical chemical vapor deposition system.

2. Description of the Related Art

In a conventional vertical chemical vapor deposition system, the operators have measured the surface temperature of the susceptor and the surface temperature of wafers placed on the susceptor in the following manner. That is, the operators have set a measuring point by a radiation thermometer to a target position while viewing inside of a reaction chamber form a view port provided at a ceiling of the reaction chamber. As described above, in order to visibly reconfirm the measuring point, the operators must look into the reaction chamber, which is in a high temperature state. For this reason, there is a problem relevant to the operation in the conventional vertical chemical vapor deposition system. In addition, it is not always easy to accurately set the measuring point to the target position; for this reason, there is a problem that the position on the measuring point is subtly different depending on the operators.

In a vertical chemical vapor deposition system, generally, the susceptor is heated by an induction heating coil arranged below the susceptor. The temperature distribution within the surface of the susceptor is adjusted, in a step of assembling, by setting the heights of several parts of the coil manually. However, it takes long time to adjust the heights manually, and it is not easy to get uniform temperature distribution within the surface of the susceptor.

BRIEF SUMMARY OF THE INVENTION

The present invention has been made in order to solve the above problems arisen when measuring the surface temperature of the susceptor and wafers in the reaction chamber and arisen when controlling temperature distribution within the surface of the susceptor. Accordingly, it is an object of the present invention to provide a vertical chemical vapor deposition system, which can measure the surface temperature of the susceptor and wafers in the reaction chamber accurately and improve temperature distribution within the surface of the susceptor.

According to the present invention, there is provided a vertical chemical vapor deposition system comprising:

a reaction chamber comprising a base and a bell jar;

a susceptor arranged in the reaction chamber;

an induction heating coil arranged below the susceptor, and heating wafers placed on the susceptor;

a height adjusting device for supporting the induction heating coil and adjusting a distance between the susceptor and at least a part of the coil;

an observation port provided in the bell jar;

a radiation thermometer arranged outside the observation port, and measuring a surface temperature of the susceptor and the wafers placed on the susceptor;

a drive mechanism supporting the radiation thermometer, and moving a measuring point by the radiation thermometer in a radial direction of the susceptor; and a control unit controlling the drive mechanism, and sequentially setting the measuring point by the radiation thermometer to preset positions so that an output of the radiation thermometer at each measuring point can be captured, and controlling the height adjusting device so that the output of the radiation thermometer coincides with a predetermined value.

In the vertical chemical vapor deposition system of the present invention, the movement of the drive mechanism and the capture timing of the output of the radiation thermometer interlocking therewith are previously set to the control unit. By doing so, it is possible to automatically perform the position setup of the measuring points by the radiation thermometer and the capture of the output from the radiation thermometer without doing a manual work by the operators. By adjusting the heights of parts of the induction heating coil based on the temperature distribution thus acquired, it is possible to get uniform temperature distribution within the surface of the susceptor accurately and automatically without doing manual work by the operator.

BRIEF DESCRIPTION OF THE SEVERAL VIEWS OF THE DRAWING

FIG. 1 is a cross-sectional view schematically showing the structure of a vertical chemical vapor deposition system according to the present invention;

DETAILED DESCRIPTION OF THE INVENTION

Figure 2:
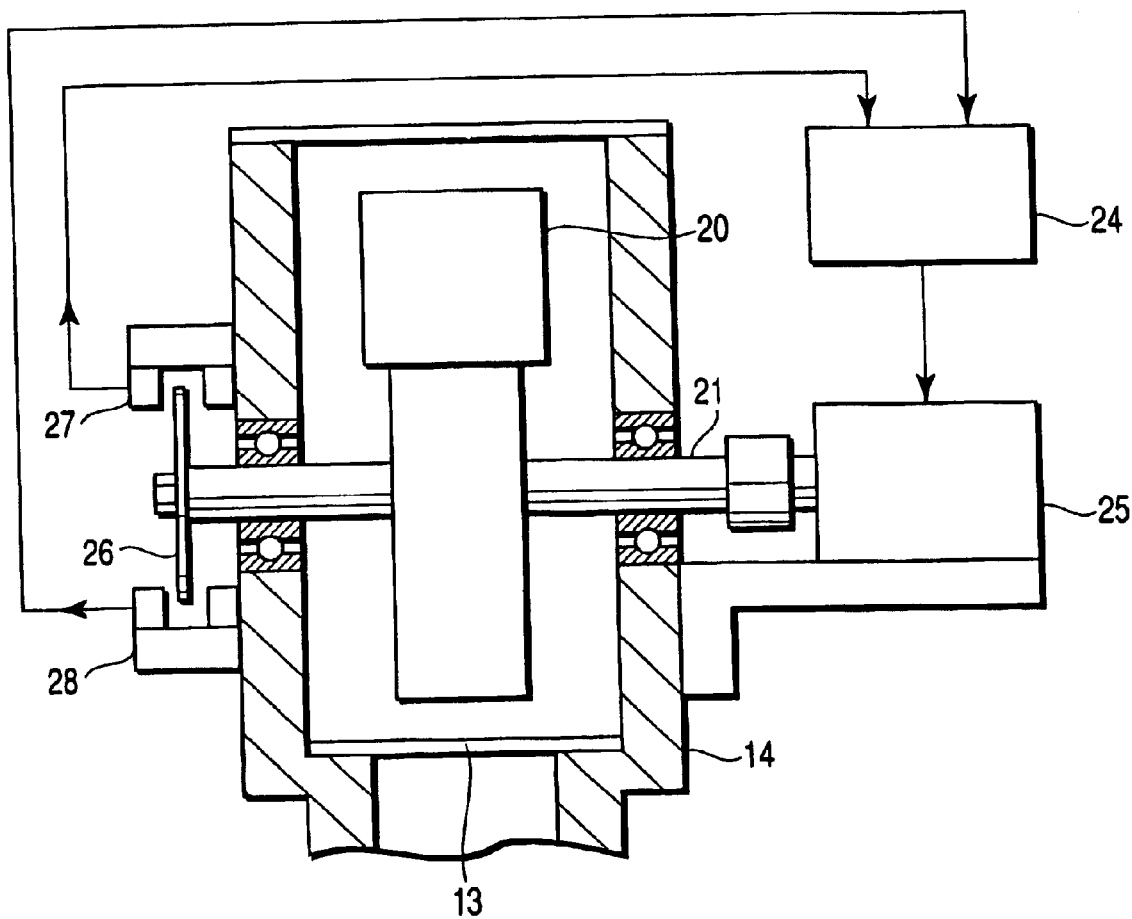
FIG. 2 is a view showing an infrared radiation thermometer used for the vertical chemical vapor deposition system according to the present invention and the structure of its drive mechanism.

FIG. 1 schematically shows the structure of a vertical chemical vapor deposition system according to the present invention. In FIG. 1, a reference numeral 1 denotes a base, 2 denotes a bell jar, 3 denotes a reaction chamber, 4 denotes a susceptor, 13 denotes an observation port for temperature detection (hereinafter, referred to as observation port), and 20 denotes an infrared radiation thermometer (radiation thermometer).

The reaction chamber 3 is formed in a manner that the base 1 is covered with the bell jar 2. In the reaction chamber 3, a disk-like susceptor 4 is arranged. An induction heating coil 5 is arranged at the lower side of the susceptor 4. Wafers 10, which become an object for chemical vapor deposition reaction, are placed on the susceptor 4.

The susceptor 4 is fixed onto an upper end of a hollow rotary shaft 6 at the center portion of the susceptor. The hollow rotary shaft 6 is penetrated through the center of the base 1, and is connected to a motor 7 at the lower side of the base 1. A reaction gas supply nozzle 8 penetrates through the inside of the hollow rotary shaft. The base 1 is attached with an exhaust pipe 9.

The induction heating coil 5 is covered with a coil cover 30 made of silica glass. The coil cover 30 has a shape of donut, and is placed on the base 1 of the reaction chamber 3 in a state that the lower portion is opened. An internal space of the coil cover 30 is kept under an inert gas atmosphere by inert gas supply and exhaust means (not shown).

A ceiling of the bell jar 5 is formed with a view port 11 made of heat-resistant glass, and a observation port 13 made of heat-resistant glass for temperature detection, which is capable of transmitting infrared rays. The outside of the view port 11 is attached with a shielding cover 12, which is capable of freely opening and closing. The outside of the observation port 13 for temperature detection is provided with a housing 14. An infrared radiation thermometer 20 is installed in the housing 14. The infrared radiation thermometer 20 is supported to a rotation axis 21, and is capable of turning around the rotation axis 21, as described later.

FIG. 2 shows the infrared radiation thermometer 20 and the structure of the drive mechanism.

The infrared radiation thermometer 20 is supported to the rotation axis 21. The rotation axis 21 is supported to a sidewall of the housing 14 via a bearing. One end portion of the rotation axis 21 is connected to a stepping motor 25. A control unit 24 controls the stepping motor 25 so that the turning angle of the infrared radiation thermometer 20 can be operated.

The other end portion of the rotation axis 21 is attached with a shielding plate 26. The shielding plate 26 is a disk provided a notch on its periphery. The sidewall of the housing 14 is attached with two photo sensors 27 and 28 so as to correspond to the shielding plate 26. The above shielding plate 26 and two photo sensors 27 and 28 make detection that the turning angle of the infrared radiation thermometer 20 reaches the limit position. Each signal from two photo sensors 27 and 28 is sent to the control unit 24, and thereafter, used for controlling the turning angle of the infrared radiation thermometer 20.

Figure 3:
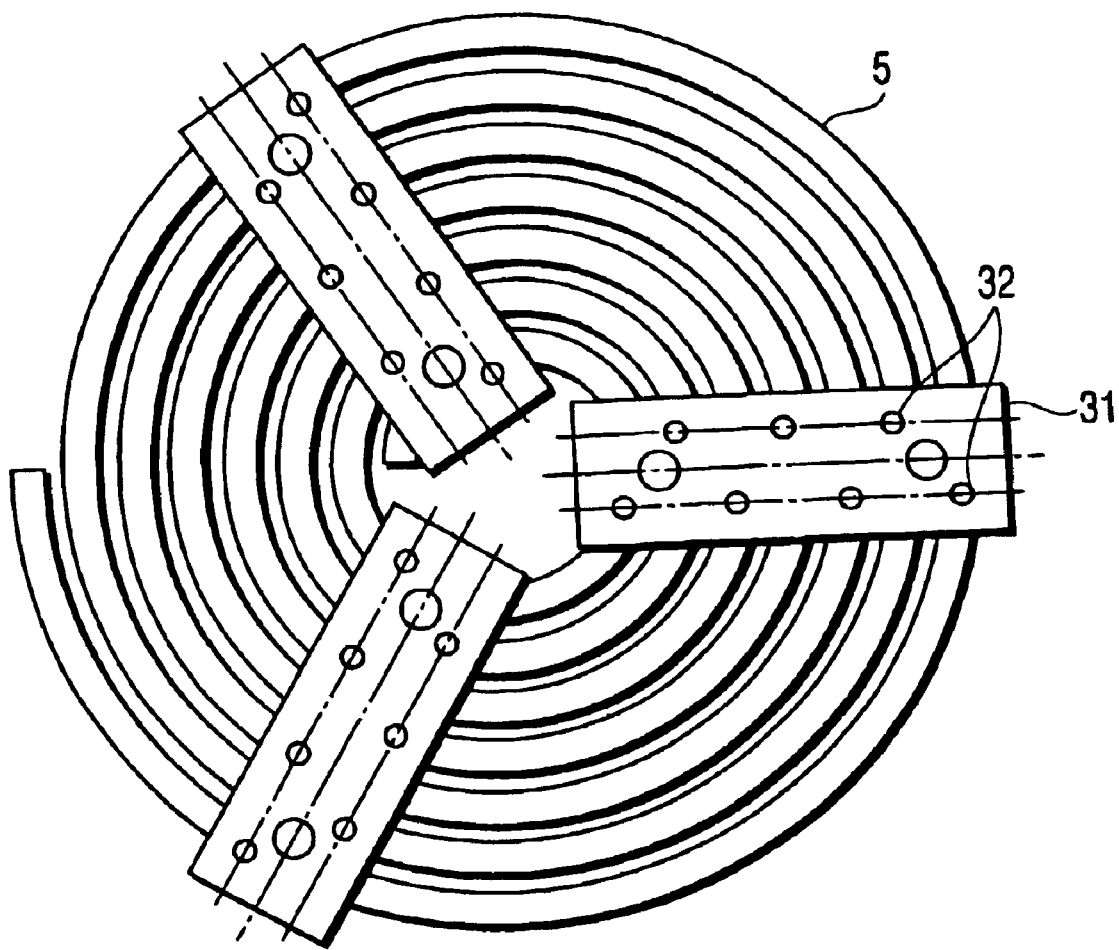
FIG. 3 is a view showing an induction heating coil used for the vertical chemical vapor deposition system according to the present invention, and is a view as seen from a lower side.

FIG. 3 shows the induction heating coil 5, and is a view as seen it from a lower side. The induction heating coil 5 is formed into a shape of spiral. The lower side of the induction heating coil 5 is provided with three retainer plates 31, which are arranged in the circumferential direction at equal intervals. Each retainer plate 31 is formed with a plurality of through holes (e.g., seven in the embodiment), and each shaft 32 penetrates through the retainer plate 31, and extends upwardly. The shafts 32 support the induction heating coil 5 a plurality of points along the length of the coil 5.

More specifically, as shown in FIG. 1, the distal end of each shaft 32 is formed with a male screw, and a nut 33 is attached to each position on the lower surface of the induction heating coil 5 by welding. The above male screw is screwed into the nut 33. Each shaft 32 is rotated in a forward or backward direction by a servomotor 34 provided at the lower side of the base 1. A coil position control unit 35 controls the rotating direction and the rotation amount of the servomotor 34.

The following is a description of the operation of the coil position control unit 35. The coil position control unit 35 captures the output of the infrared radiation thermometer 20 while capturing the output of the control unit 24 (see FIG. 2) for controlling the turning angle of the infrared radiation thermometer 20. In the above manner, the temperature of the susceptor 4 or the wafer 10 placed thereon is detected along the radial direction of the susceptor 4 so that the temperature distribution on the susceptor 4 can be detected in the radial direction. Each servomotor 34 is driven so that the temperature distribution becomes uniform, and thereby, the height at each position on the induction heating coil 5, that is, a distance between the susceptor 4 and the induction heating coil 5 at each position is individually adjusted.

Figure 4:
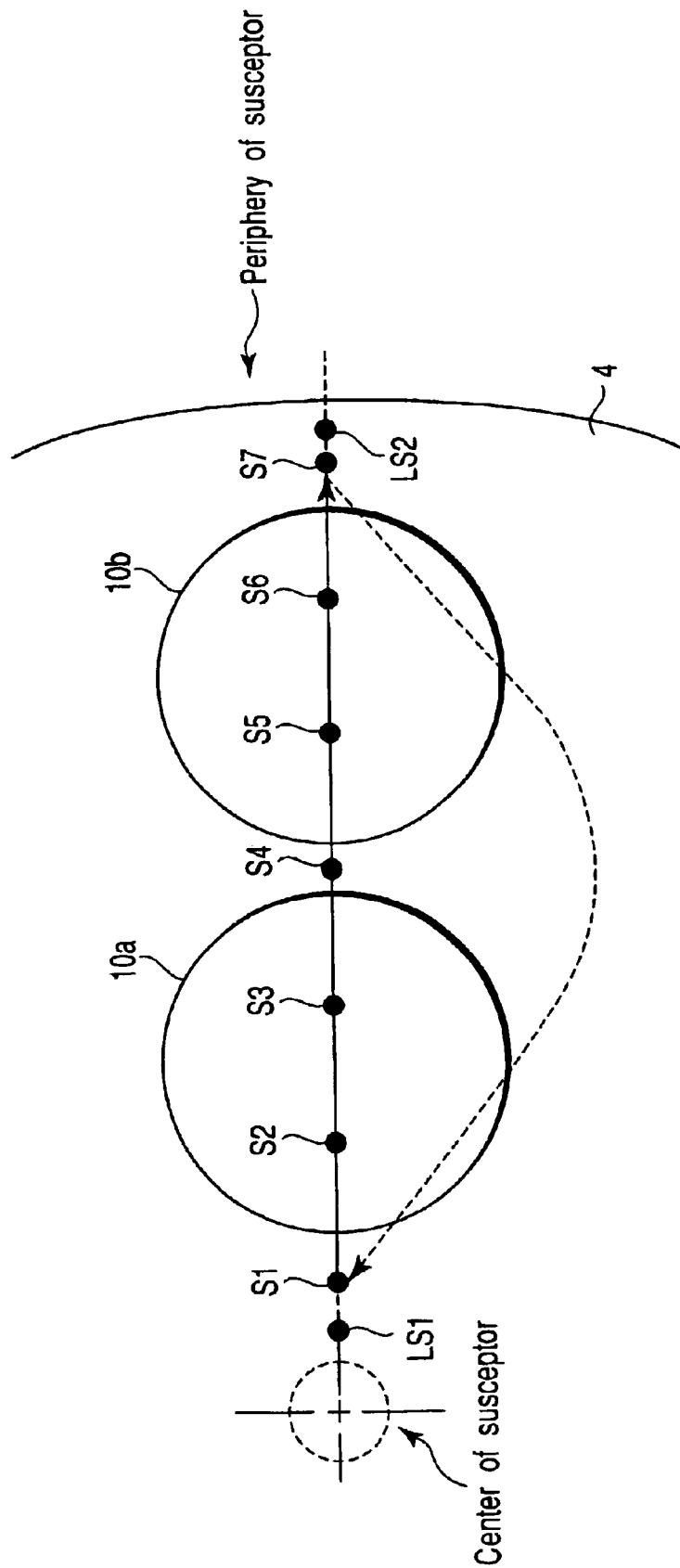
FIG. 4 is a view to explain one example when setting a plurality of temperature measuring points on the surface of wafers.

FIG. 4 is a view to explain an example for setting a plurality of temperature measuring points on the wafer surface. In the example, a plurality of wafers is concentrically arranged on the susceptor 4. More specifically, wafers 10a are arranged on the inner concentric circle; on the other hand, wafers 10b are arranged on the outer concentric circle. The infrared radiation thermometer 20 can turn to right and left directions of FIG. 4 along the straight line extending to the radial direction through the center of the susceptor 4.

In FIG. 4, LS1 and LS2 denote the right and left limit position in the turning angle of the infrared radiation thermometer 20. S1 to S7 are temperature measuring points on the susceptor 4. Each of these points is set on the surface of the susceptor 4 at the position corresponding to the average radius of each turn of the induction heating coil 5, which is arranged below the susceptor 4. The measuring point S1 (the origin) near the center of the susceptor 4 is set at the position corresponding to the average radius of the most inside turn of the induction heating coil 5. The measuring point S7 (the return point) near the periphery of the susceptor 4 is set at the position corresponding to the average radius of the most outside turn of the induction heating coil 5.

The following is a description of a method of setting a reference direction of the turning angle of the infrared radiation thermometer 20 to the origin S1, and a method of adjusting the attachment position of the photo sensors 27 and 28.

The infrared radiation thermometer 20 is attached with a light source (not shown). The operators adjust the turning angle of the infrared radiation thermometer 20 so that the reaching point of rays comes onto the origin S1 (preset) while visually observing the reaching point of rays from the view port 11. The turning angle at that time is set as a reference direction (an angle of 0°). Further, in the above state, the attachment position of the photo sensor 27 is adjusted so that the photo sensor 27 has a predetermined positional relation to the shielding plate 26.

Likewise, the operators adjust the turning angle of the infrared radiation thermometer 20 so that the reaching point of rays comes onto the return point S7 (preset) while visually observing the reaching point of rays from the view port 11. The turning angle at that time is registered to the control unit 24, and simultaneously, in the state, the attachment position of the photo sensor 28 is adjusted so that the photo sensor 28 has a predetermined positional relation to the shielding plate 26.

The setup of the turning angle limit of the infrared radiation thermometer 20 may use other detection means such as the combination of dog and limit switch, in place of the above method of using the shielding plate 26 and the photo sensors 27 and 28. The setup of the return point S7 may be made by manually inputting the turning angle from the origin S1 to the control unit 24.

The following is a description of the operation when detecting the surface temperature distribution on the susceptor and the wafers 10a and 10b placed on the susceptor.

Other adjustments including the reference direction are previously carried out, and thereafter, the infrared radiation thermometer 20 (see FIG. 2) is waiting in a state that the turning angle is set to the origin S1 (see FIG. 4) based on the instructions from the control unit 24. When receiving the detection instruction, the control unit 24 controls the stepping motor 25 so that the infrared radiation thermometer 20 can be set to the preset measuring points S1 to S7 in succession.

More specifically, first, the stepping motor 25 is rotated by a previously given rotation amount so that the infrared radiation thermometer 20 can be set to the origin S1. The infrared radiation thermometer 20 is temporally stopped at the position set above so that the temperature on the origin S1 can be captured in the control unit 24. Sequentially, the stepping motor 25 is rotated by a previously given rotation amount so that the infrared radiation thermometer 20 can be set to the next measuring point S2. The infrared radiation thermometer 20 is temporally stopped at the position set above so that the temperature on the measuring point S2 can be captured in the control unit 24. Hereinafter, according to the same procedure as above, each temperature on the measuring points S3 to S7 is captured in succession in the control unit 24. When the temperature detection on the return point S7 is completed, the control unit 24 controls the stepping motor 25 so that the infrared radiation thermometer 20 can be returned to the origin S1, and thus, one-time detection is completed.

In this case, the shielding plate 26 and the photo sensors 27 and 28 are provided in order to prevent the turning angle of the infrared radiation thermometer 20 from diverging from the limited range. When the photo sensors 27 and 28 make detection that the direction of the infrared radiation thermometer 20 reaches the limit positions LS1 and LS2, the control unit 24 immediately stops the stepping motor 25.

As described above, the control unit 24 (see FIG. 2) turns the infrared radiation thermometer 20, and thereby, each temperature of the susceptor 4 and the wafers 10a and 10b place thereon is detected. The temperature detected on each position of S1 to S7 (FIG. 4) is captured in the coil position control unit 35 (see FIG. 1).

The temperature detection is made at only one portion in the circumferential direction of the susceptor 4. Since the susceptor 4 is rotated at several to tens of revolutions per minute, the temperature of the susceptor becomes uniform in the circumferential direction. Therefore, there is no problem even if the temperature detection position is only one portion in the circumferential direction.

The coil position control unit 35 calculates a rotation amount of the servomotor 34, which is connected to the shaft 32 corresponding to each turn of the induction heating coil 5, based on the temperature detection result so that each temperature on the S1 to S7 positions becomes uniform. Further, the coil position control unit 35 rotates the shaft 32 so that the height of each position of the induction heating coil 5 can be adjusted. That is, when increasing the temperature, the induction heating coil 5 is moved upwardly so that it can approach the susceptor 4. When reducing the temperature, the induction heating coil 5 is moved downwardly so that it can be separated from the susceptor 4. By doing so, the temperature of the susceptor 4 can be made uniform easily and securely.

In the above embodiment, the servomotor 34 is connected to all shafts 32 supporting the induction heating coil 5 at three support portions in the circumferential direction so that the height of the induction heating coil 5 can be adjusted. The present invention is not limited to the above embodiment. As described before, the temperature distribution of the susceptor 4 in the circumferential direction is made uniform by the rotation of the susceptor 4. Therefore, in a step of assembling, the heights of the induction heating coil 5 are roughly adjusted at three support portions in the circumferential direction, and fine adjustment of the heights by the servomotors 34 may be made at only one of three support portions in the circumferential direction.

In addition, it is not necessary to adjust the heights of the induction heating coil 5 at all of the support positions arranged in radial direction, but the heights of the induction heating coil 5 may be adjusted at a part of the support positions corresponding to the center area and peripheral area of the susceptor 4, in which temperature adjustment is difficult. In such a case, it is preferable to set the temperature measuring points S1 to S7 so that these points include the radial positions corresponding to the part of the support positions where the height adjustment is made.

As is seen from the above description, according to the vertical chemical vapor deposition system of the present invention, it is possible to measure the surface temperature of the susceptor arranged in the reaction chamber and the wafer placed on the susceptor accurately, and to secure uniform temperature distribution within the surface of the susceptor.

What is claimed is:

1. A vertical chemical vapor deposition system comprising:
   a reaction chamber comprising a base and a bell jar;
   a susceptor arranged in the reaction chamber;
   an induction heating coil arranged below the susceptor, and heating wafers placed on the susceptor;
   a height adjusting device for supporting the induction heating coil and adjusting a distance between the susceptor and at least a part of the coil;
   an observation port provided in the bell jar;
   a radiation thermometer arranged outside the observation port, and measuring a surface temperature of the susceptor and the wafers placed on the susceptor;
   a drive mechanism supporting the radiation thermometer, and moving a measuring point by the radiation thermometer in a radial direction of the susceptor; and
   a control unit controlling the drive mechanism, and sequentially setting the measuring point by the radiation thermometer to preset positions so that an output of the radiation thermometer at each measuring point can be captured, and controlling the height adjusting device so that the output of the radiation thermometer coincides with a predetermined value.

2. A vertical chemical vapor deposition system according to claim 1, in which
   said induction heating coil is formed into a shape of spiral; and,
   each of said measuring points by the radiation thermometer is set on the surface of the susceptor at the position corresponding to the average radius of each turn of the induction heating coil.

3. A vertical chemical vapor deposition system according to claim 1, in which
   said induction heating coil is formed into a shape of spiral; and,
   said height adjusting device supports the induction heating coil at a plurality of positions along the length of the coil and is capable of adjusting, independently, distances between the susceptor and at least two of said positions of the coil.

4. A vertical chemical vapor deposition system according to claim 3, in which
   said height adjusting device is comprising:
      a plurality of retainer plates arranged in the circumferential direction of the susceptor and extending in the radial direction of the susceptor;
      a plurality of shafts penetrating through the retainer plates and supporting the induction heating coil;
      servomotors connected to at least two of the shafts respectively and used to rotate said at least two of the shafts.
      feed screws provided at the connecting points of said at least two of the shafts to the induction heating coil.

5. A vertical chemical vapor deposition system according to claim 4, in which
    said servomotors are connected only to the shafts penetrating one of the retainer plates.

6. A vertical chemical vapor deposition system according to claim 4, in which
    said servomotors are connected to the shafts which include at least the shafts supporting the most inside turn and most outside turn of the induction heating coil.

7. A vertical chemical vapor deposition system according to claim 4, in which
    said measuring points by the radiation thermometer are set so that these points include the radial positions on the surface of the susceptor corresponding to the shafts to which said servomotors are connected.

* * * * *